(12) United States Patent
Kim et al.

(10) Patent No.: US 8,290,007 B2
(45) Date of Patent: Oct. 16, 2012

(54) APPARATUS AND METHOD FOR STABILIZING FREQUENCY OF LASER

(75) Inventors: Jae-Wan Kim, Daejeon (KR); Tae-Bong Eom, Daejeon (KR); Jong-Ahn Kim, Daejeon (KR); Chu-Shik Kang, Daejeon (KR)

(73) Assignee: Korea Research Institute of Standards and Science (KR)

( * ) Notice: Subject to any disclaimer, the term of this patent is extended or adjusted under 35 U.S.C. 154(b) by 230 days.

(21) Appl. No.: 12/676,294

(22) PCT Filed: Aug. 19, 2008

(86) PCT No.: PCT/KR2008/004799
§ 371 (c)(1),
(2), (4) Date: Mar. 3, 2010

(87) PCT Pub. No.: WO2009/031769
PCT Pub. Date: Mar. 12, 2009

(65) Prior Publication Data
US 2010/0177795 A1      Jul. 15, 2010

(51) Int. Cl.
*H01S 3/13*      (2006.01)
(52) U.S. Cl. .......................... 372/32; 372/29.02
(58) Field of Classification Search ............... 372/29.02, 372/32
See application file for complete search history.

(56) References Cited

U.S. PATENT DOCUMENTS

| 4,881,231 A | 11/1989 | Jain |
| 4,907,237 A * | 3/1990 | Dahmani et al. ................. 372/32 |
| 5,754,574 A | 5/1998 | Lofthouse-Zeis et al. |
| 2007/0008995 A1 | 1/2007 | Oozeki et al. |

FOREIGN PATENT DOCUMENTS

| JP | 62-089378 | 4/1987 |
| JP | 08-204275 | 8/1996 |

OTHER PUBLICATIONS

International Search Report—PCT/KR2008/004799 dated Feb. 25, 2009.
Written Opinion—PCT/KR2008/004799.

* cited by examiner

*Primary Examiner* — Armando Rodriguez
(74) *Attorney, Agent, or Firm* — Cantor Colburn LLP (57) ABSTRACT

A frequency-stabilized laser apparatus and a method for stabilizing the frequency of a laser are disclosed. A semiconductor laser emits a beam. An external reflector has a resonance frequency and feeds back the emitted beam to the semiconductor laser if the frequency of the emitted beam is equal to the resonance frequency. An interference signal generator generates an interference signal for detecting the wavelength of the emitted beam and a controller detects the wavelength of the beam from the generated interference signal. According to the frequency-stabilized laser apparatus and the method for stabilizing the frequency of the laser, it is possible to stabilize the frequency of the beam emitted from the semiconductor laser and output the beam having the stable frequency for a long period of time.

11 Claims, 11 Drawing Sheets

APPARATUS AND METHOD FOR STABILIZING FREQUENCY OF LASER

BACKGROUND OF THE INVENTION

1. Field of the Invention

The present invention relates to a frequency-stabilized laser apparatus and a method for stabilizing the frequency of a laser, and more particularly to a frequency-stabilized laser apparatus and a method for stabilizing the frequency of a beam emitted from a semiconductor laser.

2. Description of the Related Art

A semiconductor laser has characteristics such as a small size, low power consumption, low cost due to mass production, high efficiency, a long life span of a million hours or more, a wide oscillation wavelength, a wide gain bandwidth, a high output due to the employment of an array structure, and the intensity and the frequency of a beam which can be directly controlled by an applied current, compared with other lasers. Due to such characteristics, the semiconductor laser is widely used in various application fields including optical communication or a light source of a compact disc player.

Among the various application fields, in order to use the laser as a high-precision light source, the frequency of the laser should be stabilized to a predetermined value. A method for stabilizing the frequency of the laser includes a method using spectral lines of atoms, a method using a Fabry-Perot interferometer, and a method using Zeeman effect. In the method using the spectral lines of the atoms, available spectral lines of the atoms are necessary. In addition, since the frequency of the laser can be stabilized only in a specific wavelength and the laser apparatus is complicated, this method is widely used in laboratories rather than industries. In the method using the Fabry-Perot interferometer, the stability is excellent, but a stabilized region is too narrow. Thus, this method is used as auxiliary means of another stabilizing method. The method using the Zeeman effect is representatively and widely used in a He—Ne laser. However, in this case, since the characteristics of a medium are excessively restricted, it is impossible to apply this method to other lasers excluding the He—Ne laser.

SUMMARY OF THE INVENTION

Therefore, the present invention has been made in view of the above problems, and it is an object of the present invention to provide a frequency-stabilized laser apparatus and a method for stabilizing the frequency of a laser, which is capable of stabilizing the frequency of a beam emitted from a semiconductor laser, outputting a beam having a stable frequency for a long period of time, selectively outputting the beam having the stable frequency in each of free spectral ranges for a long period of time, and accurately calculating the frequency of the output beam with high resolution.

In accordance with the present invention, the above and other objects can be accomplished by the provision of a frequency-stabilized laser apparatus including: a semiconductor laser which emits a beam; an interference signal generator which generates an interference signal for detecting the wavelength of the emitted beam; a controller which detects the wavelength from the generated interference signal and adjusts current applied to the semiconductor laser according to the detected wavelength so as to primarily stabilize the frequency of the laser beam; and an external reflector which has a resonance frequency and feeds back the emitted beam to the semiconductor laser through an optical resonator so as to finally stabilize the frequency of the semiconductor laser, if the frequency of the emitted beam is equal to the resonance frequency.

The external reflector may include an optical resonator which has the resonance frequency and outputs the beam fed back to the semiconductor laser if the frequency of the emitted beam is equal to the resonance frequency, a first unit which irradiates the beam emitted from the semiconductor laser to the optical resonator, and a second unit which feeds back the beam output from the optical resonator to the semiconductor laser. The first unit and the second unit may be equal to each other. Preferably, the external reflector may further include a first optical detector which detects the beam transmitting through the optical resonator, and, in this case, the controller may detect the resonance frequency from the detected beam. If the resonance frequency is detected, the controller fixes the temperature of the semiconductor laser or the current applied to the semiconductor laser such that the frequency of the beam is locked to the resonance frequency.

The interference signal generator may include a sample substrate having a predetermined thickness, a light irradiation unit which irradiates the emitted beam to the sample substrate, and an optical detection unit which detects the light beam reflected from the sample substrate.

The light irradiation unit may include an optical splitter which splits the emitted beam into a first beam and a second beam, and an optical path adjuster which changes the incident angles of the split first and second beams to be different from each other and irradiates the beams to the sample substrate.

The optical detection unit may include a ¼ wavelength plate which adjusts the polarization of the first beam and the second beam reflected from the sample substrate and transmits the first beam and the second beam, a polarized light splitter which reflects the transmitted first and second beams, a second optical detector which detects the reflected first beam, and a third optical detector which detects the reflected second beam.

The controller may include a wavelength calculator which detects the wavelength of the beam from the generated interference signal, a control signal calculator which calculates a control signal on the basis of the detected wavelength, and an adjuster which adjusts the temperature of the semiconductor laser or current applied to the semiconductor laser according to the calculated control signal.

Preferably, the frequency-stabilized laser apparatus may further include an optical transmission unit which splits the emitted beam and irradiates the split beams to the external reflector and the interference signal generator. The light transmission unit may include a first optical splitter which splits the emitted beam and irradiates a portion of the split beams to the external reflector, an optical insulator which transmits the remaining portion of the split beam, and a second optical splitter which splits the transmitted beam, irradiates a portion of the split beams to the interference signal generator, and externally emits the remaining portion of the split beam.

In accordance with another aspect of the present invention, the above and other objects can be accomplished by the provision of a method for stabilizing the frequency of a beam emitted from a semiconductor laser, the method including: detecting the wavelength of the beam emitted from the semiconductor laser; adjusting the temperature of the semiconductor laser or current applied to the semiconductor laser on the basis of the detected wavelength; detecting a resonance frequency of the beam; and feeding back the beam to the semiconductor laser so as to stabilize the frequency of the laser beam, if the resonance frequency of the beam is detected.

The detecting of the wavelength may include splitting the emitted beam into a first beam and a second beam, irradiating the first beam and the second beam to a sample substrate with different incident angles, detecting the first beam and the second beam reflected from the sample substrate, and detecting the wavelength of the beam from the interference signal generated from the detected first and second beams.

The detecting of the frequency may include irradiating the emitted beam to an optical resonator, detecting the beam transmitting through the optical resonator, and detecting the resonance frequency from the detected beam.

According to the frequency-stabilized laser apparatus and the method for stabilizing the frequency of the laser, it is possible to stabilize the frequency of the beam emitted from the semiconductor laser and output the beam having the stable frequency for a long period of time. In addition, it is possible to adjust the temperature of the semiconductor laser or the current applied to the semiconductor laser to selectively output the beam having the stable frequency in each of free spectral ranges for a long period of time and accurately calculate the frequency of the output beam with high resolution.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Hereinafter, an apparatus and a method according to the embodiments of the present invention will be described with reference to the accompanying drawings.

Figure 1:
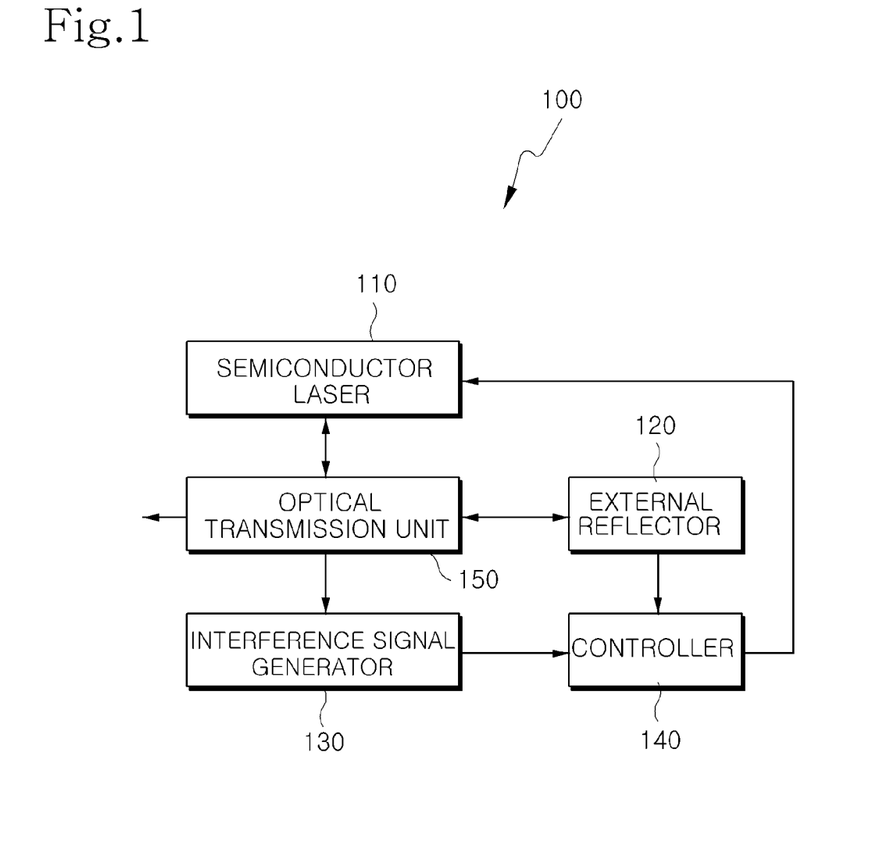
FIG. 1 is a block diagram showing the configuration of a frequency-stabilized laser apparatus according to an embodiment of the present invention.

FIG. 1 is a block diagram showing the configuration of a frequency-stabilized laser apparatus according to an embodiment of the present invention.

Referring to FIG. 1, the frequency-stabilized laser apparatus 100 according to the present invention includes a semiconductor laser 110, an external reflector 120, an interference signal generator 130, a controller 140 and an optical transmission unit 150.

The semiconductor laser 110 emits a beam. The frequency or the wavelength of the beam is primarily controlled by the controller 140. The frequency of the beam is fixed and stabilized by a physical phenomenon, such as beam feedback, in which the beam is fed back from the external reflector 120.

The external reflector 120 has the resonance frequency and feeds back the beam emitted from the semiconductor laser 110 to the semiconductor laser 110 if the frequency of the beam emitted from the semiconductor laser 110 is equal to the resonance frequency. The beam emitted from the semiconductor laser 110 is locked to the resonance frequency by the beam fed back to the semiconductor laser 110. At this time, the semiconductor laser 110 emits the beam having the stable frequency. As the external reflector 120, a reflection mirror, an optical lattice, an optical fiber resonator or a Fabry-Perot resonator may be used.

Figure 2:
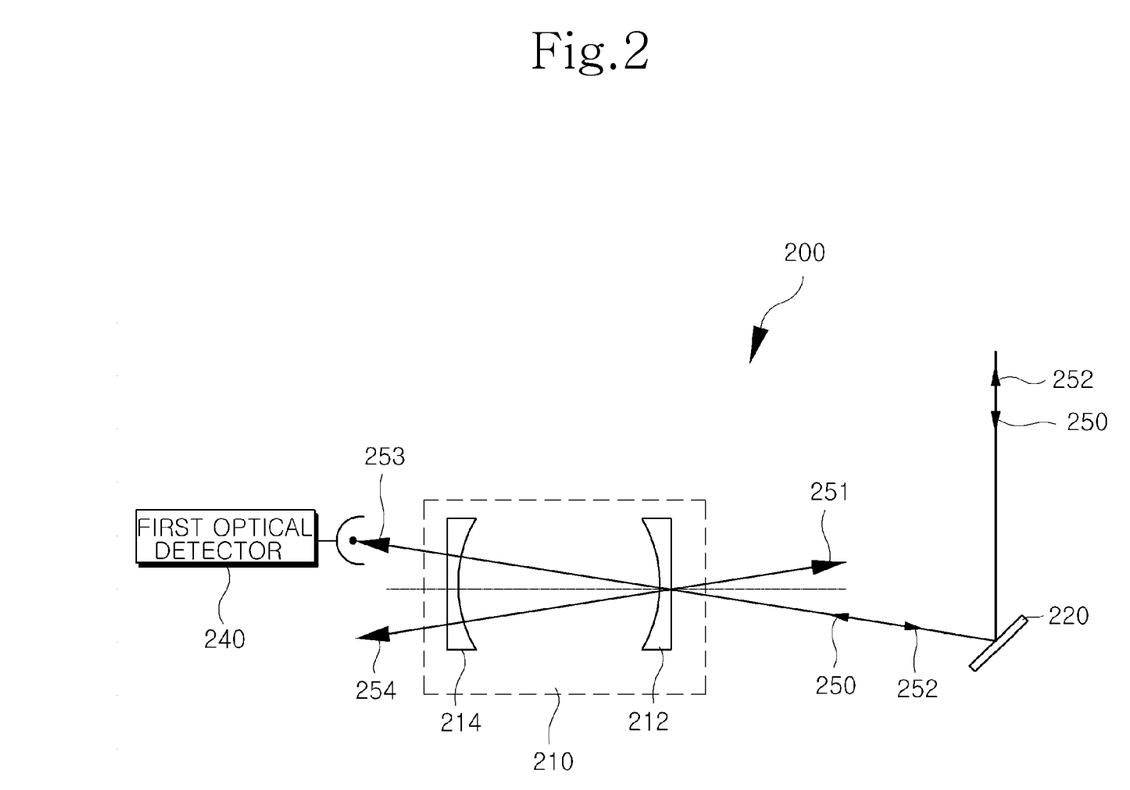
FIG. 2 is a view showing the schematic structure of an external reflector of the frequency-stabilized laser apparatus according to the embodiment of the present invention.

FIG. 2 is a view showing the schematic structure of the external reflector of the frequency-stabilized laser apparatus according to the embodiment of the present invention.

Referring to FIG. 2, the external reflector includes an optical resonator 210, a first unit 220, a second unit 220, and a first optical detector 240.

The optical resonator 210 has the resonance frequency and amplifies an incident beam and outputs the amplified beam in order to feed back the beam to the semiconductor laser 110 if the frequency of the beam emitted from the semiconductor laser 110 is equal to the resonance frequency. The optical resonator 210 includes two reflection mirrors 212 and 214. For example, the two reflection mirrors 212 and 214 are arranged so as to be spaced apart from each other by the same length as the radius of curvature of the reflection mirrors.

The first unit 220 for irradiating the beam emitted from the semiconductor laser 110 to the optical resonator 210 may be equal to the second unit 220 for feeding back the beam amplified by the optical resonator 210 to the semiconductor laser 110.

The first unit 220 inputs the beam 250 emitted from the semiconductor laser 110 to the reflection mirror 212. The beam input to the reflection mirror 212 is converted into four beams 251, 252, 253 and 254 and the four beams 251, 252, 253 and 254 are emitted from the optical resonator 210. The beam 251 is constituted by the beam reflected from the reflection mirror 212 and the beam transmitted from a resonance region of the optical resonator 210 and has minimum power if the frequency of the beam emitted from the semiconductor laser 110 is equal to the resonance frequency. In contrast, the beams 252, 253 and 254 are constituted by the beam transmitted from the resonance region of the optical resonator 210 and have maximum power if the frequency of the beam emitted from the semiconductor laser 110 is equal to the resonance frequency. When the beam 252 has the maximum power, the beam 252 is fed back to the semiconductor laser 110 by the second unit 220.

The first optical detector 240 detects the beam 253 transmitting through the optical resonator 210. The controller 140 checks whether or not the beam 253 detected by the first optical detector 240 resonates and detects the frequency of the detected beam 253 as the resonance frequency if the beam resonates.

Figure 3:
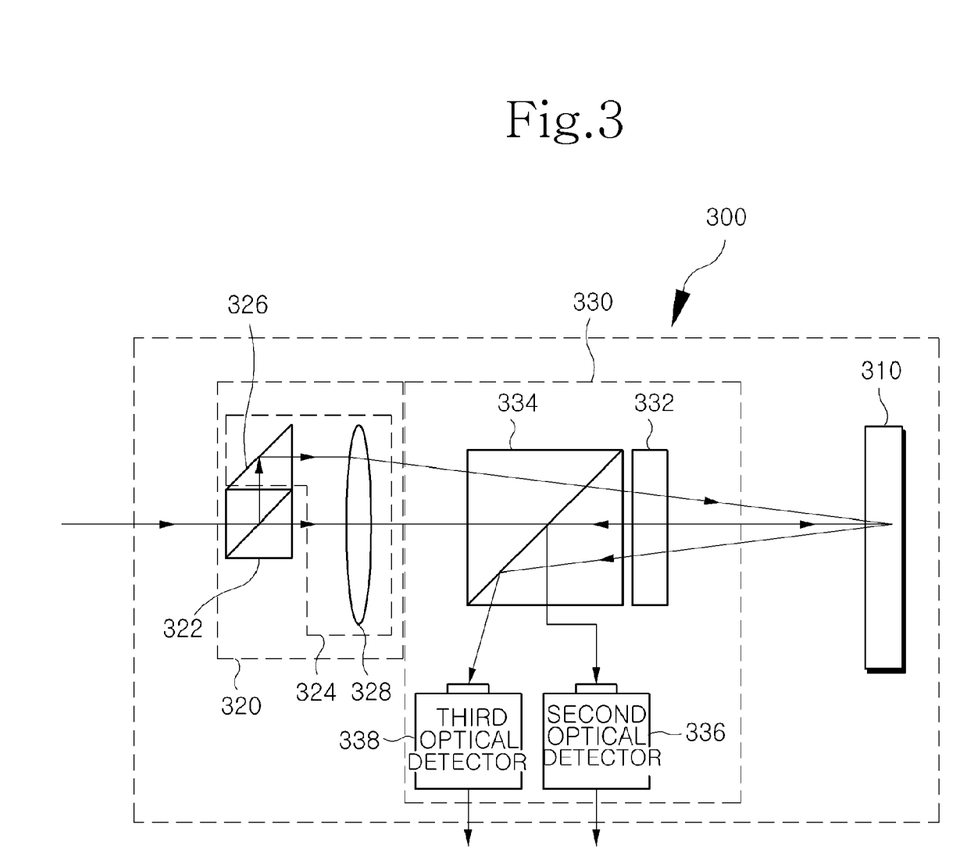
FIG. 3 is a view showing the schematic structure of an interference signal generator of the frequency-stabilized laser apparatus according to the embodiment of the present invention.
Figure 4:
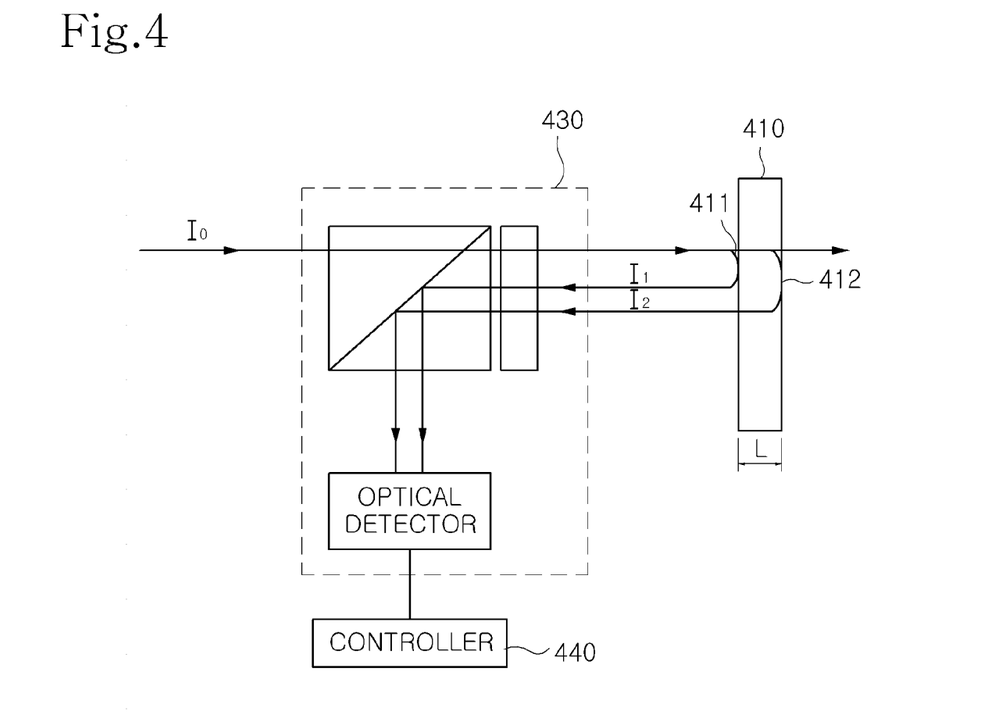
FIG. 4 is a view showing a wavelength measurement principle of the frequency-stabilized laser apparatus according to the embodiment of the present invention.

FIG. 3 is a view showing the schematic structure of the interference signal generator of the frequency-stabilized laser apparatus according to the embodiment of the present invention, and FIG. 4 is a view showing a wavelength measurement principle of the frequency-stabilized laser apparatus according to the embodiment of the present invention.

Referring to FIGS. 3 and 4, the interference signal generator 300 detects the wavelength of the beam emitted from the semiconductor laser 110. The interference signal generator 300 includes a sample substrate 310, a light irradiation unit 320 and an optical detection unit 330.

The sample substrate 310 has a predetermined thickness and may be, for example, a glass substrate. If the thickness L of the sample substrate 410 is previously known, an interference phenomenon of the beams reflected from the sample substrate 410 may be analyzed such that the wavelength of the beam $I_0$ incident to the sample substrate 410 is detected. The beam $I_1$ reflected from the front surface 411 of the sample substrate 410 and the beam $I_2$ reflected from the rear surface 412 of the sample substrate interfere with each other. Due to the interference, the intensity of the beam detected by the optical detection unit 430 is periodically changed with time. The controller 440 analyzes the intensity of the beam changed by the interference phenomenon and calculates the wavelength of the beam emitted from the semiconductor laser 110. The interference signal generator 300 inputs the beam emitted from the semiconductor laser 110 to the sample substrate 310, generates the interference phenomenon between the beams reflected from the sample substrate 310, generates an interference signal, and outputs the interference signal to the controller 140.

The light irradiation unit 320 irradiates the beam emitted from the semiconductor laser 110 to the sample substrate 310. The light irradiation unit 320 includes an optical splitter 322 and an optical path adjuster 324. The optical splitter 322 splits the beam emitted from the semiconductor laser 110 into a first beam and a second beam. The optical path adjuster 324 changes the incident angles of the first beam and the second beam split by the optical splitter 322 to be different from each other and adjusts the light paths such that the beams are input to the sample substrate 310. The optical path adjuster 324 includes a focus lens 328 and a reflection mirror 326. The reflection mirror 326 reflects the beam irradiated from the optical splitter 322 and irradiates the beam to the focus lens 328. The focus lens 328 refracts the incident beams having different incident angles such that the beams are input to the sample substrate 310.

As another embodiment, the light irradiation unit 320 may input the beam emitted from the semiconductor laser 110 to the sample substrate 310 without performing a process of splitting the beam emitted from the semiconductor laser 110.

The light irradiation unit 330 detects the light reflected from the sample substrate 310. The optical detection unit 330 includes a ¼ wavelength plate 332, a polarized light splitter 334, a second optical detector 336 and a third optical detector 338. The ¼ wavelength plate 332 adjusts the polarization of the first beam and the second beam reflected from the sample substrate 310 and transmits the polarized beams. The polarized light splitter 334 reflects the polarized first beam and the polarized second beam to the second optical detector and the third optical detector. That is, since the polarized light splitter 334 transmits the first beam and the second beam split by the optical splitter 322 and reflects the polarized first beam and the polarized second beam, the polarized light splitter 334 may be located midway between the optical splitter 322 and the sample substrate 310. The second optical detector 336 and the third optical detector 338 detect the first beam and the second beam reflected from the polarized light splitter 334, respectively.

Figure 5:
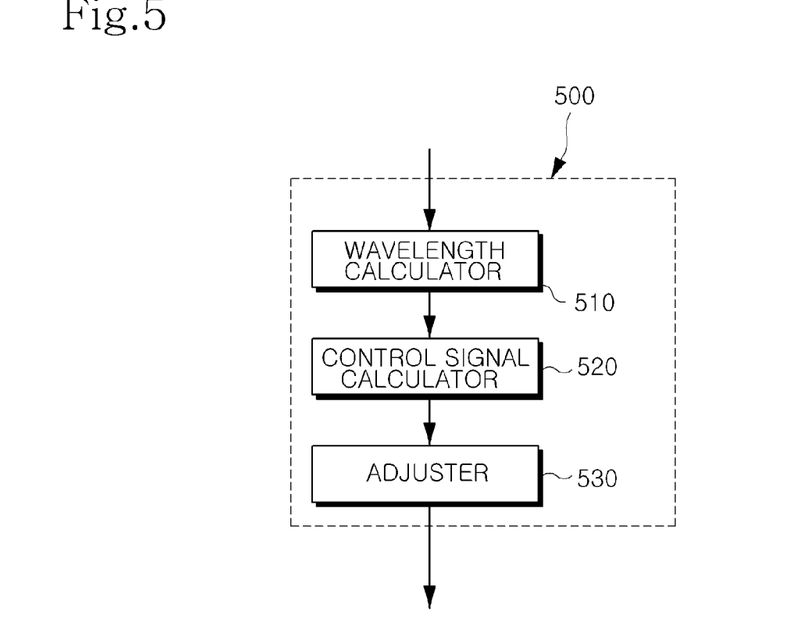
FIG. 5 is a block diagram showing the configuration of a controller of the frequency-stabilized laser apparatus according to the embodiment of the present invention.

FIG. 5 is a block diagram showing the configuration of the controller of the frequency-stabilized laser apparatus according to the embodiment of the present invention.

Referring to FIG. 5, the controller 140 detects the wavelength of the beam emitted from the semiconductor laser 110 from the interference signal generated by the interference signal generator 130, detects the resonance frequency from the beam detected by the external reflector 120, adjusts the current applied to the semiconductor laser 110 or the temperature of the semiconductor laser 110, and controls the semiconductor laser 110. The controller 500 includes a wavelength calculator 510, a control signal calculator 520 and an adjuster 530.

The wavelength calculator 510 detects the wavelength of the beam from the interference signal generated by the interference signal generator 130. That is, the wavelength calculator 510 analyzes the interference phenomenon between the first beam and the second beam, which are respectively detected by the second optical detector 336 and the third optical detector 338, and detects the wavelength of the beam emitted from the semiconductor laser 110.

The wavelength calculator 510 calculates the wavelength λ of the beam detected by the second optical detector 336 and the third optical detector 338 by Equation 1.

$$I = I_1 + I_2 + 2\sqrt{I_1 I_2} \cos\left(\frac{4\pi n L}{\lambda}\right) \qquad \text{Equation 1}$$

where, I denotes the intensity of the beam detected by the optical detectors 336 and 338, $I_1$ and $I_2$ denote the intensities of the light beams which are reflected from the front surface and the rear surface of the sample substrate 310 and detected by the optical detectors 336 and 338, and n denotes a refractive index of the sample substrate, and L denotes the thickness of the sample substrate.

If the incident angles of the first beam and the second beam, which are split by the optical splitter 322 and made incident to the sample substrate 310, are adjusted by the optical path adjuster 324 such that a difference between the phases of the beams detected by the optical detectors 336 and 338 becomes 90 degrees, the intensity $I_{pd2}$ of the beam detected by the second optical detector 336 may be expressed by Equation 2 according to Equation 1.

$$I_{pd2} = I_1 + I_2 + 2\sqrt{I_1 I_2} \cos\left(\frac{4\pi n L}{\lambda}\right) \qquad \text{Equation 2}$$

If the incident angles of the first beam and the second beam to the sample substrate 310 are adjusted such that a difference between the phases of the beams detected by the optical detectors 336 and 338 becomes 90 degrees, the intensity $I_{pd3}$ of the beam detected by the third optical detector 336 is expressed by Equation 3.

$$I_{pd3} = I_1 + I_2 + 2\sqrt{I_1 I_2} \cos\left(\frac{4\pi nL}{\lambda}\right)$$  Equation 3

The wavelength calculator 510 may calculate the wavelength of the beam emitted from the semiconductor laser 110 from Equation 2 and Equation 3.

Figure 6:
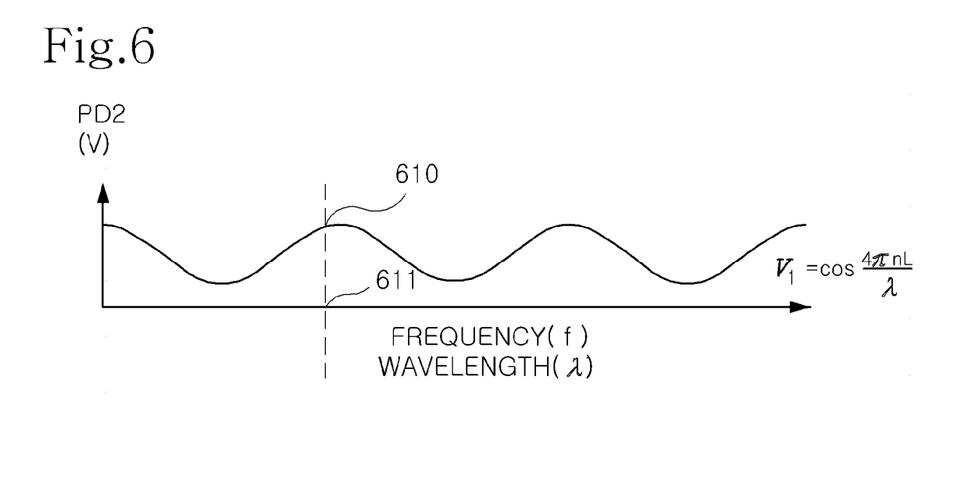
FIG. 6 is a graph showing the intensity of a beam detected by a second optical detector according to the frequency, in the frequency-stabilized laser apparatus according to the present invention.
Figure 7:
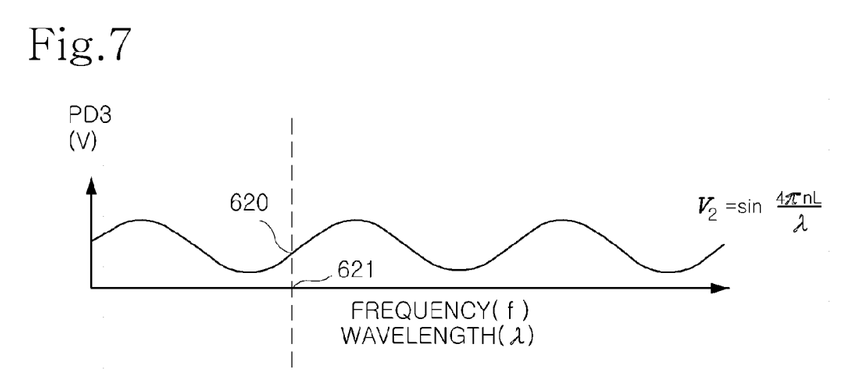
FIG. 7 is a graph showing the intensity of a beam detected by a third optical detector according to the frequency, in the frequency-stabilized laser apparatus according to the present invention.
Figure 8:
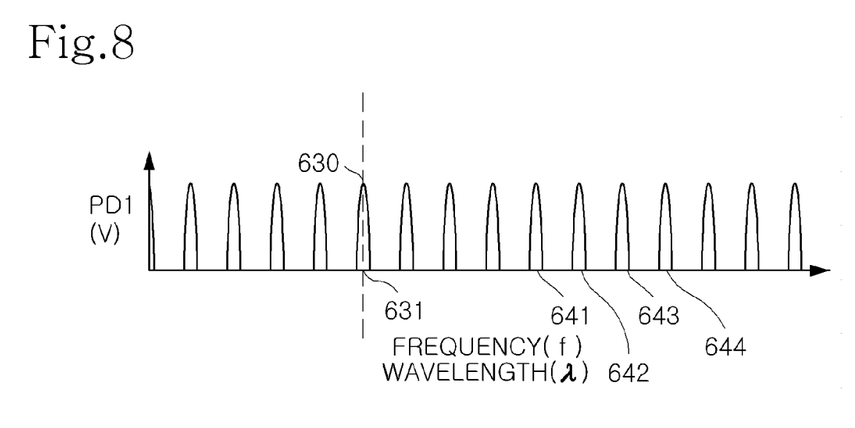
FIG. 8 is a graph showing the intensity of a beam detected by a first optical detector according to the frequency, in the frequency-stabilized laser apparatus according to the present invention.

FIG. 6 is a graph showing the intensity of the beam detected by the second optical detector according to the frequency, in the frequency-stabilized laser apparatus according to the present invention, FIG. 7 is a graph showing the intensity of the beam detected by the third optical detector according to the frequency, in the frequency-stabilized laser apparatus according to the present invention, and FIG. 8 is a graph showing the intensity of the beam detected by the first optical detector according to the frequency, in the frequency-stabilized laser apparatus according to the present invention.

Referring to FIGS. 6 to 8, the wavelength calculator 510 detects the resonance frequency from the beam detected by the external reflector 120. If a time when the resonance frequency is detected is t and the intensity of the beam detected by the second optical detector 336 is $A_1$ (610), the wavelength calculator 510 calculates the wavelength $\lambda_1$ (611). Similarly, if the intensity of the beam detected by the third optical detector 338 is $A_2$ (620) at the time t, the wavelength calculator 510 calculates the wavelength $\lambda_2$ (621). If the wavelength calculator 510 detects the resonance frequency at the time t, the wavelength $\lambda_0$ (631) is calculated from Equation 4. The wavelength calculator 510 detects the frequency of the beam detected by the external reflector 120 as the resonance frequency at a point 630 where the intensity of the beam detected by the external reflector 120 has a maximum value. If the resonance frequency is detected, the wavelength calculator 510 adds $\lambda_0$ to the calculated $\lambda_1$ and $\lambda_2$ such that the wavelength of the beam emitted from the semiconductor laser 110 is accurately detected with higher resolution. Accordingly, the frequency-stabilized laser apparatus 100 according to the present invention can accurately calculate the wavelength of the beam emitted from the semiconductor laser 110 with high resolution using the resonance frequency.

$$C = f \times \lambda$$  Equation 4 where, C denotes the velocity of the light beam, f denotes the resonance frequency, and $\lambda$ denotes the wavelength.

The control signal calculator 520 calculates a control signal on the basis of the detected wavelength. The control signal calculator 520 may calculate the control signal for calculating the wavelength of a specific region according to an external command. That is, the control signal calculator 520 calculates a variation value of the temperature of the semiconductor laser 110 and a variation value of the current applied to the semiconductor laser 110 if a request for increasing the wavelength region is externally received.

The control signal calculator 520 calculates the control signal for fixing the current applied to the semiconductor laser 110 and the temperature of the semiconductor laser 110 such that the frequency of the beam emitted from the semiconductor laser 110 is locked to the resonance frequency detected by the wavelength calculator 510. At this time, the control signal calculator 520 calculates the respective control signals for adjusting the temperature and the current separately or together.

The adjuster 530 adjusts the current applied to the semiconductor laser 110 or the temperature of the semiconductor laser 110 according to the control signal calculated by the control signal calculator 520. The wavelength region of the beam emitted from the semiconductor laser 110 is changed according to the variation of the temperature and the current adjusted by the adjuster 530.

The controller 140 changes and fixes the temperature of the semiconductor laser 110 and the current applied to the semiconductor laser 110 so as to allow the semiconductor laser 110 to primarily emit the beam having the stable frequencies 641, 642, 643 and 644 for a long period of time.

Accordingly, the frequency-stabilized laser apparatus 100 according to the present invention can generate the beam having the stable frequency in each of various frequency regions and accurately calculate the wavelength of the generated beam with high resolution.

Figure 9:
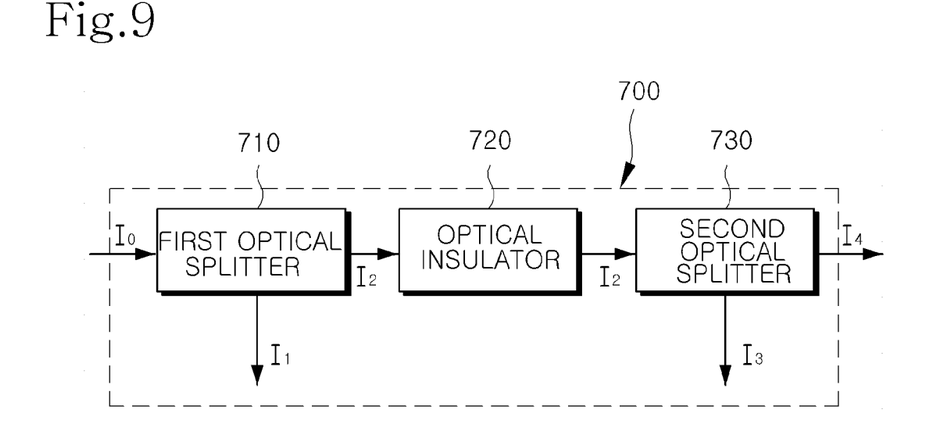
FIG. 9 is a block diagram showing the configuration of an optical transmission unit of the frequency-stabilized laser apparatus according to the embodiment of the present invention.

FIG. 9 is a block diagram showing the configuration of the optical transmission unit of the frequency-stabilized laser apparatus according to the embodiment of the present invention.

Referring to FIG. 9, the optical transmission unit 700 splits the beam emitted from the semiconductor laser 110 and irradiates the split beams to the external reflector 120 and the interference signal generator 130. The optical transmission unit 700 includes a first optical splitter 710, an optical insulator 720 and a second optical splitter 730. The first optical splitter 710 splits the beam $I_0$ emitted from the semiconductor laser 110 and irradiates a portion $I_1$ of the split beams to the external reflector 120. The optical insulator 720 transmits the remaining portion $I_2$ of the beam split by the first optical splitter 710, that is, the beam $I_2$ which is not irradiated to the external reflector 120, to the second optical splitter 730. The optical insulator 720 has a function for maintaining the intensity of the transmitted beam $I_2$ and preventing retroreflection. The second optical splitter 730 splits the beam $I_2$ transmitting through the optical insulator 720, irradiates a portion $I_3$ of the split beams to the interference signal generator 130 and externally irradiates the remaining portion $I_4$ of the split beams.

Figure 10:
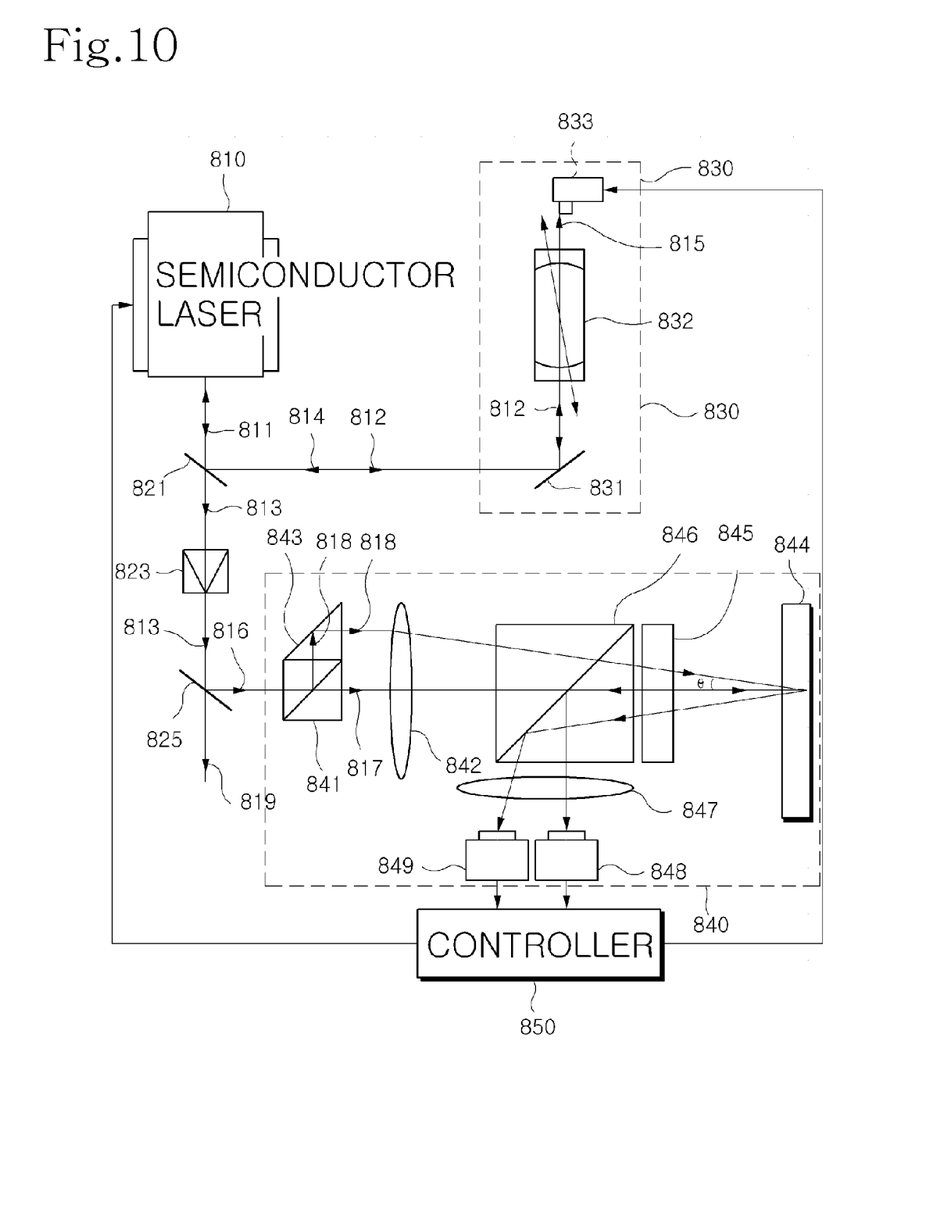
FIG. 10 is a view showing the schematic structure of the frequency-stabilized laser apparatus according to an embodiment of the present invention.

FIG. 10 is a view showing the schematic structure of an apparatus for stabilizing the frequency of a laser according to an embodiment of the present invention.

Referring to FIG. 10, a beam 811 emitted from a semiconductor laser 810 is split into a first beam 812 and a second beam 813 by a first optical splitter 821. The split first beam 812 is irradiated to an external reflector 830 and is input to an optical resonator 832 by a first unit 831. When the first beam 812 resonates by the optical resonator 832, a beam 814 emitted from the optical resonator 832 is fed back to the semiconductor laser 810 such that the frequency of the beam is stabilized by a physical phenomenon such as beam feedback, and a beam 815 transmitting through the optical resonator 832 is detected by a first optical detector 833. A controller 850 detects a resonance frequency from the detected beam 815.

The second beam 813 is transmitted through an optical insulator 823 and irradiated to a second optical splitter 825. The second beam 813 irradiated to the second optical splitter 825 is split into a third beam 816 and a fourth beam 819. The split third beam 816 is irradiated to an interference signal generator 840 and the split fourth beam 819 is externally emitted. The third beam 816 irradiated to the interference signal generator 840 is split into a fifth beam 817 and a sixth beam 818 by an optical splitter 841. The fifth beam 817 split by the optical splitter 841 is transmitted through a focus lens 842 and input to a sample substrate 844. At this time, the incident angle of the incident fifth beam 817 is 0 (vertical incidence). The sixth beam 818 split by the optical splitter 841 is reflected by a reflection mirror 843 and the reflected sixth beam 818 is transmitted through the focus lens 842 and input to the sample substrate 844. At this time, a difference θ between the incident angles of the fifth beam 817 and the sixth beam 818 has a value for allowing a difference between the phases of the beams detected by a second optical detector 848 and a third optical detector 849 to become 90 degrees. That is, the optical path of the sixth beam 818 is adjusted by the reflection mirror 843 and the focus lens 842 such that the difference between the phases of the beams detected by the second optical detector 848 and the third optical detector 849 becomes 90 degrees. The respective portions of the fifth beam 817 and the sixth beam 818 are reflected from the front surface of the sample substrate 844 and the remaining portions thereof are reflected from the rear surface of the sample substrate 844 and the reflected beams are input to a ¼ wavelength plate. The fifth beam 817 and the sixth beam 818 input to the ¼ wavelength plate 845 are polarized and input to a polarized light splitter 846, and the beams reflected from the polarized light splitter 846 are irradiated to a focus lens 847. The fifth beam 817 and the sixth beam 818 irradiated to the focus lens 847 are respectively focused and detected by the second optical detector 848 and the third optical detector 849.

The controller 850 calculates the wavelength of the beam 811 emitted from the semiconductor laser 810 from the interference signal generated by the detected fifth beam 817 and sixth beam 818. The controller 850 accurately calculates the wavelength of the beam 811 emitted from the semiconductor laser 810 on the basis of the resonance frequency of the beam 815 detected by the first optical detector 833. The controller 850 adjusts the temperature of the semiconductor laser 810 and the current applied to the semiconductor laser 810 on the basis of the calculated wavelength and controls the semiconductor laser 810 to emit the beam having a stable frequency.

In order to realize accurate control and long-term stability in a state in which the frequency of the beam emitted from the semiconductor laser 810 is stabilized within a predetermined range through the primary control process, when the external reflector 830 resonates, the beam emitted through the optical resonator 832 is fed back to the semiconductor laser 810 such that the frequency of the beam emitted from the semiconductor laser 810 is finally stabilized using the physical phenomenon such as beam feedback.

Figure 11:
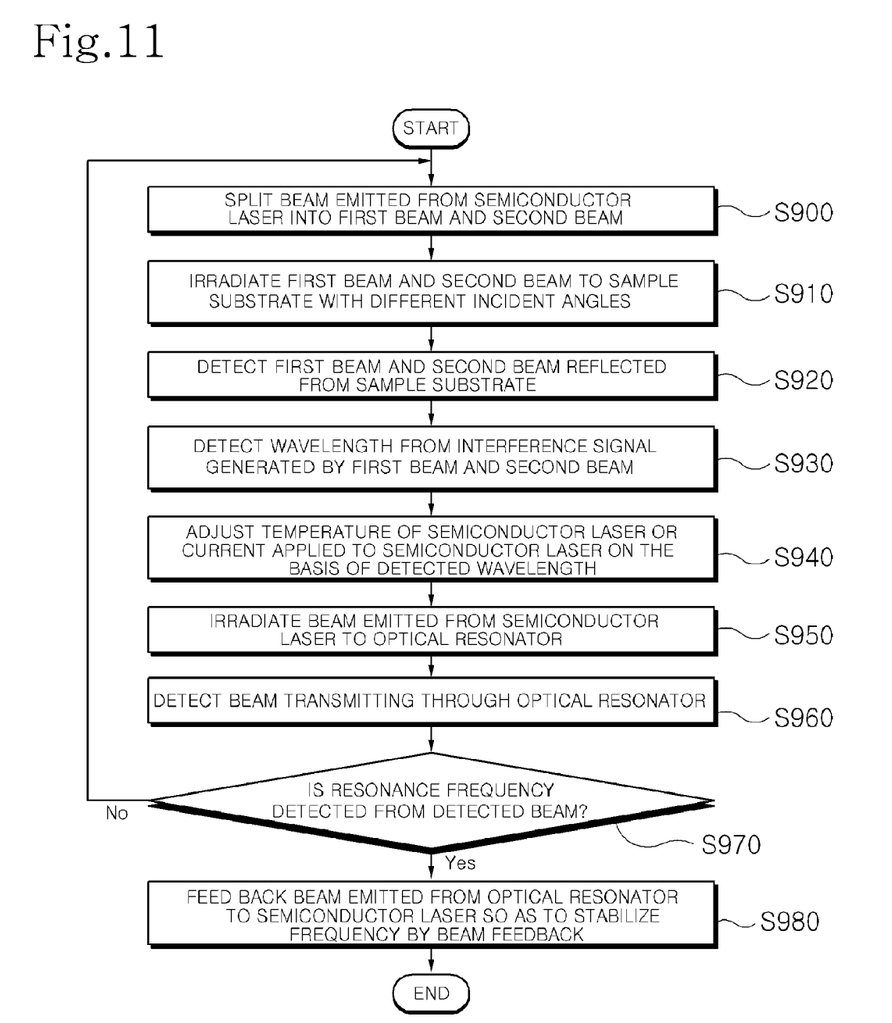
FIG. 11 is a flowchart illustrating a method for stabilizing the frequency of a laser according to an embodiment of the present invention.

FIG. 11 is a flowchart illustrating a method for stabilizing the frequency of a laser according to an embodiment of the present invention.

Referring to FIG. 11, the interference signal generator 130 splits the beam emitted from the semiconductor laser 110 into the first beam and the second beam (S900). The interference signal generator 130 irradiates the first beam and the second beam to the sample substrate with different incident angles (S910). The interference signal generator 130 detects the first beam and the second beam reflected from the sample substrate (S920). The controller 140 detects the wavelength from the interference signals generated by the first beam and the second beam detected by the interference signal generator 130 (S930). The controller 140 adjusts the temperature of the semiconductor laser 110 or the current applied to the semiconductor laser 110 on the basis of the detected wavelength so as to primarily stabilize the frequency of the beam emitted from the semiconductor laser 110 within the predetermined range (S940). The optical transmission unit 150 irradiates the beam emitted from the semiconductor laser 110 to the optical resonator (S950). The first optical detector detects the beam transmitting through the optical resonator (S960). The controller 140 checks whether the resonance frequency is detected from the beam detected by the first optical detector (S970). If the resonance frequency is detected, the optical resonator feeds back the beam emitted from the semiconductor laser 110 to the semiconductor laser 110 so as to finally (secondarily) stabilize the frequency of the beam outputted from the semiconductor laser 110 through the physical phenomenon such as beam feedback (S980).

In interference systems for measuring the shape and the distance of an object on the basis of a laser beam, various medical apparatuses and high-technology apparatuses, a frequency-stabilized laser apparatus and a method for stabilizing the frequency of a laser according to the present invention may be used as a laser apparatus for outputting a laser beam having a stable wavelength and a method for stabilizing the laser beam used in the apparatus.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A frequency-stabilized laser apparatus comprising:
a semiconductor laser which emits a beam;
an interference signal generator which generates an interference signal for detecting the wavelength of the emitted beam;
a controller which detects the wavelength from the generated interference signal and adjusts current applied to the semiconductor laser according to the detected wavelength so as to primarily stabilize the frequency of the laser beam;
an external reflector which has a resonance frequency and feeds back the emitted beam to the semiconductor laser through an optical resonator so as to finally stabilize the frequency of the semiconductor laser, if the frequency of the emitted beam is equal to the resonance frequency; and
an optical transmission unit which splits the emitted beam and irradiates the split beams to the external reflector and the interference signal generator.

2. The apparatus according to claim 1, wherein the external reflector includes:
the optical resonator which has the resonance frequency and outputs the beam fed back to the semiconductor laser if the frequency of the emitted beam is equal to the resonance frequency;
a first unit which irradiates the beam emitted from the semiconductor laser to the optical resonator; and
a second unit which feeds back the beam output from the optical resonator to the semiconductor laser.

3. The apparatus according to claim 2, wherein the first unit and the second unit are equal to each other.

4. The apparatus according to claim 2, wherein:
the external reflector further includes a first optical detector which detects the beam transmitting through the optical resonator, and
the controller detects the resonance frequency from the detected beam.

5. The apparatus according to claim 1, wherein the interference signal generator includes:
a sample substrate having a predetermined thickness;
a light irradiation unit which irradiates the emitted beam to the sample substrate; and
an optical detection unit which detects the light beam reflected from the sample substrate.

6. The apparatus according to claim 5, wherein the light irradiation unit includes:
an optical splitter which splits the emitted beam into a first beam and a second beam; and an optical path adjuster which changes the incident angles of the split first and second beams to be different from each other and irradiates the beams to the sample substrate.

7. The apparatus according to claim 5, wherein the optical detection unit includes:
- a ¼ wavelength plate which adjusts the polarization of the first beam and the second beam reflected from the sample substrate and transmits the first beam and the second beam;
- a polarized light splitter which reflects the transmitted first and second beams;
- a second optical detector which detects the reflected first beam; and
- a third optical detector which detects the reflected second beam.

8. The apparatus according to claim 1, wherein the controller includes:
- a wavelength calculator which detects the wavelength of the beam from the generated interference signal;
- a control signal calculator which calculates a control signal on the basis of the detected wavelength; and
- an adjuster which adjusts the temperature of the semiconductor laser or current applied to the semiconductor laser according to the calculated control signal.

9. The apparatus according to claim 1, wherein the optical transmission unit includes:
- a first optical splitter which splits the emitted beam and irradiates a portion of the split beams to the external reflector;
- an optical insulator which transmits the remaining portion of the split beam; and
- a second optical splitter which splits the transmitted beam, irradiates a portion of the split beams to the interference signal generator, and externally emits the remaining portion of the split beam.

10. A method for stabilizing the frequency of a beam emitted from a semiconductor laser, the method comprising:
- detecting the wavelength of the beam emitted from the semiconductor laser;
- adjusting the temperature of the semiconductor laser or current applied to the semiconductor laser on the basis of the detected wavelength;
- detecting a resonance frequency of the beam; and
- feeding back the beam to the semiconductor laser so as to stabilize the frequency of the laser beam, if the resonance frequency of the beam is detected, wherein the detecting of the wavelength includes:
- splitting the emitted beam into a first beam and a second beam;
- irradiating the first beam and the second beam to a sample substrate with different incident angles;
- detecting the first beam and the second beam reflected from the sample substrate; and
- detecting the wavelength of the beam from an interference signal generated from the detected first and second beams.

11. The method according to claim 10, wherein the detecting of the frequency includes:
- irradiating the emitted beam to an optical resonator;
- detecting the beam transmitting through the optical resonator; and
- detecting the resonance frequency from the detected beam.

* * * * *